(12) United States Patent
Taylor et al.

(10) Patent No.: US 8,999,798 B2
(45) Date of Patent: Apr. 7, 2015

(54) METHODS FOR FORMING NMOS EPI LAYERS

(75) Inventors: Mitchell C. Taylor, Lake Oswego, OR (US); Susan B. Felch, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 449 days.

(21) Appl. No.: 12/968,528

(22) Filed: Dec. 15, 2010

(65) Prior Publication Data

US 2011/0175140 A1    Jul. 21, 2011

Related U.S. Application Data

(60) Provisional application No. 61/287,351, filed on Dec. 17, 2009.

(51) Int. Cl.
*H01L 21/336* (2006.01)
*H01L 21/67* (2006.01)
(Continued)

(52) U.S. Cl.
CPC ...... *H01L 21/67207* (2013.01); *H01L 21/2018* (2013.01); *H01J 37/321* (2013.01); *H01J 37/32357* (2013.01); *H01J 37/32412* (2013.01); *H01L 21/2236* (2013.01); *H01L 21/268* (2013.01); *H01L 21/67115* (2013.01); *H01L 21/67167* (2013.01); *H01L 21/6719* (2013.01);
(Continued)

(58) Field of Classification Search
CPC ............... H01L 21/02529; H01L 21/02634; H01L 21/2018; H01L 21/2236; H01L 21/268
USPC ..................... 438/300; 257/E21.09, E21.619
See application file for complete search history.

(56) References Cited

U.S. PATENT DOCUMENTS 4,940,505 A * 7/1990 Schachameyer et al. ....... 117/97
6,303,450 B1 * 10/2001 Park et al. ..................... 438/300
(Continued)

FOREIGN PATENT DOCUMENTS

| JP | 2000-223425 A | 8/2000 |
| JP | 2009-064875 | 3/2009 |

(Continued)

OTHER PUBLICATIONS

International Search Report and Written Opinion mailed Oct. 13, 2011 for PCT Application No. PCT/US2010/060708.
(Continued)

*Primary Examiner* — Joseph C Nicely
(74) *Attorney, Agent, or Firm* — Moser Taboada; Alan Taboada

(57) ABSTRACT

NMOS transistors having controlled channel strain and junction resistance and methods for the fabrication of same are provided herein. In some embodiments, a method for forming an NMOS transistor may include (a) providing a substrate having a p-type silicon region; (b) depositing a silicon seed layer atop the p-type silicon region; (c) depositing a silicon-containing bulk layer comprising silicon, silicon and a lattice adjusting element or silicon and an n-type dopant atop the silicon seed layer; (d) implanting at least one of the lattice adjusting element or the n-type dopant which is absent from the silicon-containing bulk layer deposited in (c) into the silicon-containing bulk layer; and (e) annealing the silicon-containing bulk layer with an energy beam after implantation in (d). In some embodiments, the substrate may comprise a partially fabricated NMOS transistor device having a source/drain region defined therein.

18 Claims, 8 Drawing Sheets

(51) Int. Cl.
*H01L 21/20* (2006.01)
*H01J 37/32* (2006.01)
*H01L 21/223* (2006.01)
*H01L 21/268* (2006.01)
*H01L 29/165* (2006.01)
*H01L 29/66* (2006.01)
*H01L 29/78* (2006.01)
*H01L 21/02* (2006.01)
*H01L 21/683* (2006.01)

(52) U.S. Cl.
CPC ........ *H01L 29/165* (2013.01); *H01L 29/66636* (2013.01); *H01L 29/7848* (2013.01); *H01L 21/02529* (2013.01); *H01L 21/02532* (2013.01); *H01L 21/0262* (2013.01); *H01L 21/6831* (2013.01); *H01L 29/78* (2013.01)

(56) References Cited

U.S. PATENT DOCUMENTS

| | | | |
|---|---|---|---|
| 6,358,806 B1 | 3/2002 | Puchner | |
| 6,849,527 B1 | 2/2005 | Xiang | |
| 7,005,333 B2 | 2/2006 | Li | |
| 7,115,945 B2 | 10/2006 | Lee et al. | |
| 7,132,338 B2 | 11/2006 | Samoilov et al. | |
| 7,170,084 B1 | 1/2007 | Xiang et al. | |
| 7,208,362 B2 * | 4/2007 | Chidambaram | 438/199 |
| 7,235,822 B2 | 6/2007 | Li | |
| 7,462,542 B2 | 12/2008 | Liu et al. | |
| 7,732,269 B2 | 6/2010 | Kim et al. | |
| 7,781,799 B2 * | 8/2010 | Yu et al. | 257/190 |
| 8,217,423 B2 | 7/2012 | Liu et al. | |
| 2004/0256647 A1 | 12/2004 | Lee et al. | |
| 2005/0035409 A1 * | 2/2005 | Ko et al. | 257/350 |
| 2005/0082616 A1 * | 4/2005 | Chen et al. | 257/350 |
| 2005/0145956 A1 * | 7/2005 | Wang et al. | 257/410 |
| 2005/0170604 A1 * | 8/2005 | Orlowski et al. | 438/404 |
| 2005/0255667 A1 | 11/2005 | Arghavani et al. | |
| 2005/0287752 A1 | 12/2005 | Nouri et al. | |
| 2006/0027810 A1 * | 2/2006 | Machida et al. | 257/66 |
| 2006/0131665 A1 | 6/2006 | Murthy et al. | |
| 2006/0134872 A1 | 6/2006 | Hattendorf et al. | |
| 2006/0148151 A1 * | 7/2006 | Murthy et al. | 438/197 |
| 2006/0240645 A1 * | 10/2006 | Henley | 438/455 |
| 2007/0057287 A1 * | 3/2007 | Lin et al. | 257/190 |
| 2007/0096149 A1 * | 5/2007 | Liu et al. | 257/192 |
| 2007/0108529 A1 * | 5/2007 | Huang et al. | 257/368 |
| 2007/0132054 A1 | 6/2007 | Arghavani et al. | |
| 2007/0152277 A1 | 7/2007 | Shima | |
| 2007/0190731 A1 | 8/2007 | Chen et al. | |
| 2007/0194391 A1 * | 8/2007 | Murthy et al. | 257/387 |
| 2007/0207596 A1 * | 9/2007 | Kim et al. | 438/478 |
| 2007/0259503 A1 | 11/2007 | Chang et al. | |
| 2008/0029815 A1 * | 2/2008 | Chen et al. | 257/347 |
| 2008/0057655 A1 | 3/2008 | Liu et al. | |
| 2008/0067557 A1 | 3/2008 | Yu et al. | |
| 2008/0081471 A1 * | 4/2008 | Press et al. | 438/682 |
| 2008/0102573 A1 * | 5/2008 | Liang et al. | 438/231 |
| 2008/0138939 A1 | 6/2008 | Kim | |
| 2008/0138955 A1 | 6/2008 | Ye et al. | |
| 2008/0138964 A1 | 6/2008 | Ye et al. | |
| 2008/0286957 A1 * | 11/2008 | Lee et al. | 438/607 |
| 2009/0011566 A1 * | 1/2009 | Okada et al. | 438/308 |
| 2009/0020786 A1 | 1/2009 | Lenoble et al. | |
| 2009/0061575 A1 * | 3/2009 | Kaitoh et al. | 438/166 |
| 2009/0114956 A1 * | 5/2009 | Tamura | 257/288 |
| 2009/0160012 A1 * | 6/2009 | Kim | 257/508 |
| 2009/0178751 A1 | 7/2009 | Presley et al. | |
| 2009/0203202 A1 * | 8/2009 | Huang et al. | 438/585 |
| 2009/0267149 A1 * | 10/2009 | Hua et al. | 257/347 |
| 2009/0311850 A1 * | 12/2009 | Sanchez | 438/473 |
| 2009/0317964 A1 * | 12/2009 | Suuronen et al. | 438/514 |
| 2010/0006970 A1 * | 1/2010 | Brady et al. | 257/447 |
| 2010/0140077 A1 * | 6/2010 | Koo et al. | 204/164 |
| 2010/0264470 A1 | 10/2010 | Thirupapuliyur et al. | |
| 2010/0268367 A1 * | 10/2010 | Wu et al. | 700/110 |
| 2010/0279479 A1 * | 11/2010 | Hatem et al. | 438/300 |
| 2011/0010215 A1 * | 1/2011 | Lin et al. | 705/8 |
| 2011/0037125 A1 * | 2/2011 | Cheng et al. | 257/351 |
| 2011/0165739 A1 * | 7/2011 | Majumdar et al. | 438/154 |
| 2011/0166251 A1 * | 7/2011 | Wong et al. | 523/115 |
| 2011/0298049 A1 * | 12/2011 | Liang et al. | 257/344 |
| 2011/0316079 A1 * | 12/2011 | Nieh et al. | 257/344 |
| 2012/0052646 A1 * | 3/2012 | Awano | 438/289 |
| 2012/0146092 A1 * | 6/2012 | Liu et al. | 257/190 |
| 2012/0149159 A1 * | 6/2012 | Liu et al. | 438/233 |
| 2012/0244688 A1 * | 9/2012 | Bauer et al. | 438/507 |
| 2013/0240950 A1 * | 9/2013 | Bohr | 257/190 |
| 2013/0286372 A1 * | 10/2013 | Adachi | 355/67 |
| 2013/0321995 A1 * | 12/2013 | Koyama | 361/679.01 |

FOREIGN PATENT DOCUMENTS

| | | |
|---|---|---|
| JP | 2009-147265 | 7/2009 |
| WO | WO 2008/005773 A2 | 1/2008 |
| WO | WO 2008/085686 A2 | 7/2008 |
| WO | WO 2011084575 A2 * | 7/2011 |

OTHER PUBLICATIONS

Search Report from The State Intellectual Property Office of the People's Republic of China received Oct. 2, 2014 for Chinese Patent Application No. 2010800596240.

* cited by examiner

METHODS FOR FORMING NMOS EPI LAYERS

CROSS-REFERENCE TO RELATED APPLICATIONS

This application claims benefit of U.S. provisional patent application Ser. No. 61/287,351, filed Dec. 17, 2009, which is herein incorporated by reference.

BACKGROUND

1. Field

Embodiments of the present invention generally relate to the field of semiconductor manufacturing processes and devices, and more particularly, to methods of depositing silicon-containing films to form semiconductor devices.

2. Description of the Related Art

As smaller transistors are manufactured, source/drain regions for sub-100 nm complementary metal-oxide semiconductor (CMOS) devices, such as silicon-containing metal oxide semiconductor field effect transistor (MOSFET) devices, are becoming more challenging to produce. Such MOSFET transistors may include p-channel MOS (PMOS) transistors, and n-channel MOS (NMOS) transistors. The PMOS transistor has a p-type source/drain region separated by an n-type channel (e.g., holes are responsible for conduction in the channel between the source/drain regions). The NMOS transistor has an n-type source/drain region separated by a p-type channel (e.g., electrons are responsible for conduction in the channel between the source/drain regions).

In NMOS applications, a source/drain region may be formed by etching a silicon substrate to make a recess that may be filled with a selectively grown silicon-containing layer, for example, a silicon-carbon layer, where carbon may be considered a lattice adjusting element used to adjust the lattice constant of the silicon lattice. The silicon-carbon layer is then doped with a dopant element to form the n-type source/drain region. Unfortunately, conventional processing techniques do not presently allow an epitaxial layer to be formed that incorporates silicon, a lattice adjusting element, and an n-type dopant element in a selectively grown layer that is single crystal.

SUMMARY

NMOS transistors having controlled channel strain and junction resistance and methods for the fabrication of same are provided herein. In some embodiments, a method for forming an NMOS transistor may include (a) providing a substrate having a p-type silicon region; (b) depositing a silicon seed layer atop the p-type silicon region; (c) depositing a silicon-containing bulk layer comprising silicon, silicon and a lattice adjusting element or silicon and an n-type dopant atop the silicon seed layer; (d) implanting at least one of the lattice adjusting element or the n-type dopant which is absent from the silicon-containing bulk layer deposited in (c) into the silicon-containing bulk layer; and (e) annealing the silicon-containing bulk layer with an energy beam after implantation in (d). In some embodiments, the substrate may comprise a partially fabricated NMOS transistor device having a source/drain region defined therein.

In some embodiments, an NMOS transistor may include a transistor stack comprising a gate dielectric and a gate electrode formed atop a p-type silicon region of a semiconductor substrate; and a source/drain region disposed on both sides of the transistor stack and defining a channel region therebetween and beneath the transistor stack, the source drain region comprising a silicon seed layer having a silicon-containing bulk layer deposited thereabove, wherein the silicon-containing bulk layer comprises silicon, a lattice adjusting element, and an n-type dopant. In some embodiments, the NMOS transistor may be fabricated using the methods described herein.

In some embodiments, the methods as described herein may be performed in a semiconductor process tool specially configured therefor. In some embodiments, a semiconductor process tool for processing a semiconductor substrate may include a vacuum transfer chamber having one or more substrate transfer robots disposed therein; a epitaxial deposition chamber coupled to the vacuum transfer chamber; an implantation reactor coupled to the vacuum transfer chamber; a focused beam annealing chamber coupled to the vacuum transfer chamber; a load lock chamber coupled to the vacuum process chamber; and a controller for controlling operation of the vacuum process chamber.

Other and further embodiments are described in the detailed description, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The above drawings are not to scale and may be simplified for illustrative purposes.

DETAILED DESCRIPTION

NMOS transistor devices having controlled channel strain and junction resistance and methods for the fabrication of same are provided herein. The NMOS transistor devices and methods of fabrication disclosed herein advantageously provide incorporation of silicon, a lattice adjusting element, and an n-type dopant element in a single crystal layer in the source/drain regions of the NMOS device. The inventive methods may further provide an NMOS device having high channel strain and low junction resistance in the source/drain regions. Apparatus suitable for fabrication of such devices is also provided.

Figure 1:
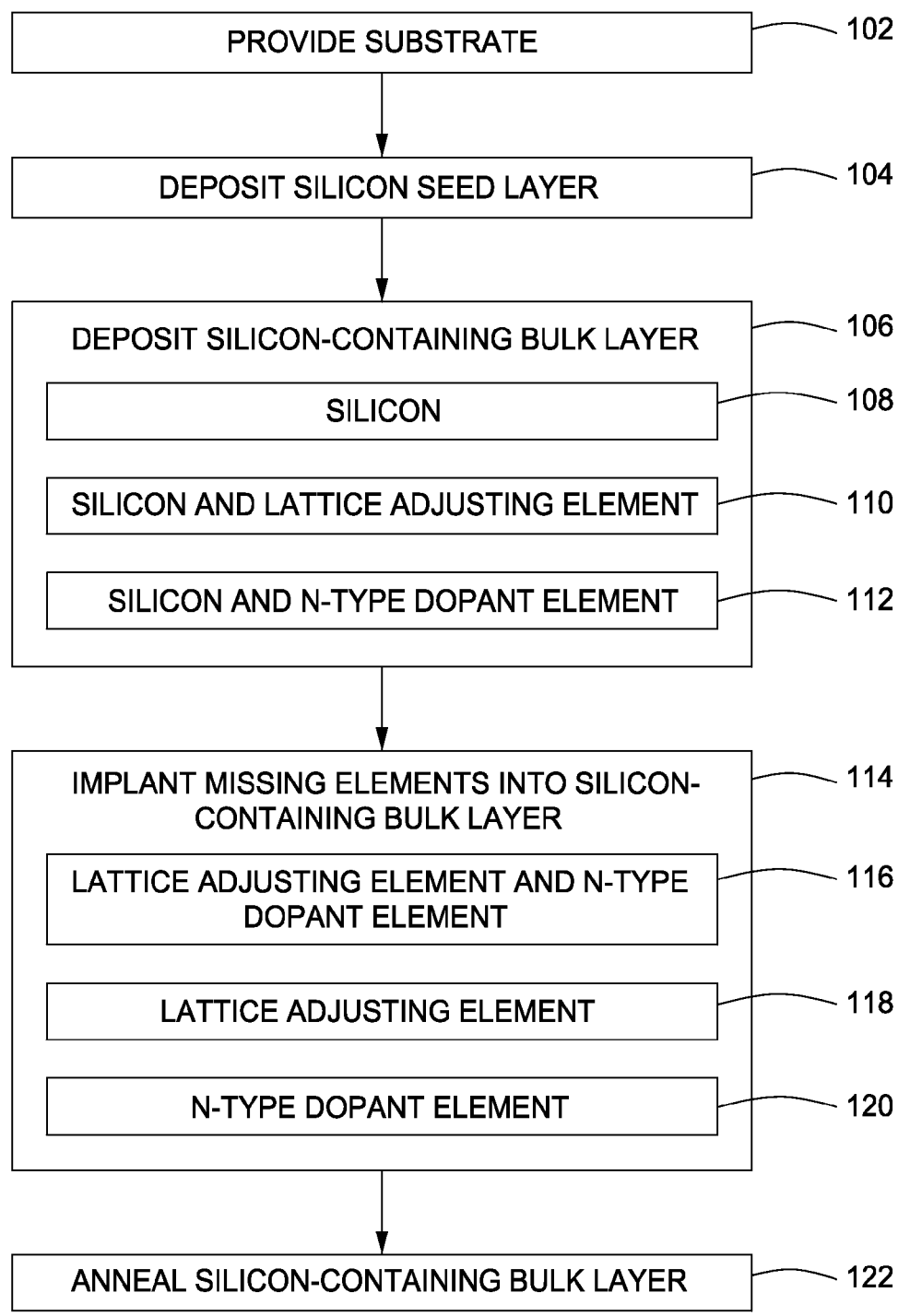
FIG. 1 depicts a flow chart of a method for deposition of a source/drain region in accordance with some embodiments of the present invention.

FIG. 1 depicts a method 100 of fabricating source/drain regions in NMOS transistor devices in accordance with some embodiments of the present invention. The method 100 is illustratively described with reference to FIGS. 2A-F, which schematically depicts stages of fabrication of the NMOS transistor device in accordance with the embodiments of the method 100. The methods described herein relating to deposition may be performed in a suitable epitaxial deposition chamber, such as the RP EPI® process chamber, available from Applied Materials, Inc. of Santa Clara, Calif., or other suitable deposition chamber, such as described below with respect to FIG. 3. Methods described herein relating to ion implantation may be performed in a suitable plasma implantation chamber, such as the P3I® process chamber, also available from Applied Materials, Inc., or another suitable ion implantation chamber, such as described below with respect to FIG. 4. Methods described herein relating to annealing may be performed in a suitable annealing chamber such as those configured for rapid thermal processing (RTP), flash annealing, focused beam annealing (such as laser annealing), or the like. One suitable laser annealing chamber is the DSA® process chamber, also available from Applied Materials, Inc., or another suitable focused beam annealing chamber, such as described below with respect to FIG. 5. The deposition chamber, plasma implantation chamber, and focused beam annealing chamber, along with other chambers suited for the fabrication of the NMOS transistor device (e.g., etch chambers, cleaning chamber, and the like) may be part of a cluster tool, such as one of the CENTURA® line of cluster tools, also available from Applied Materials, Inc. One example of a suitable cluster tool is described below with respect to FIG. 6.

Figure 2A:
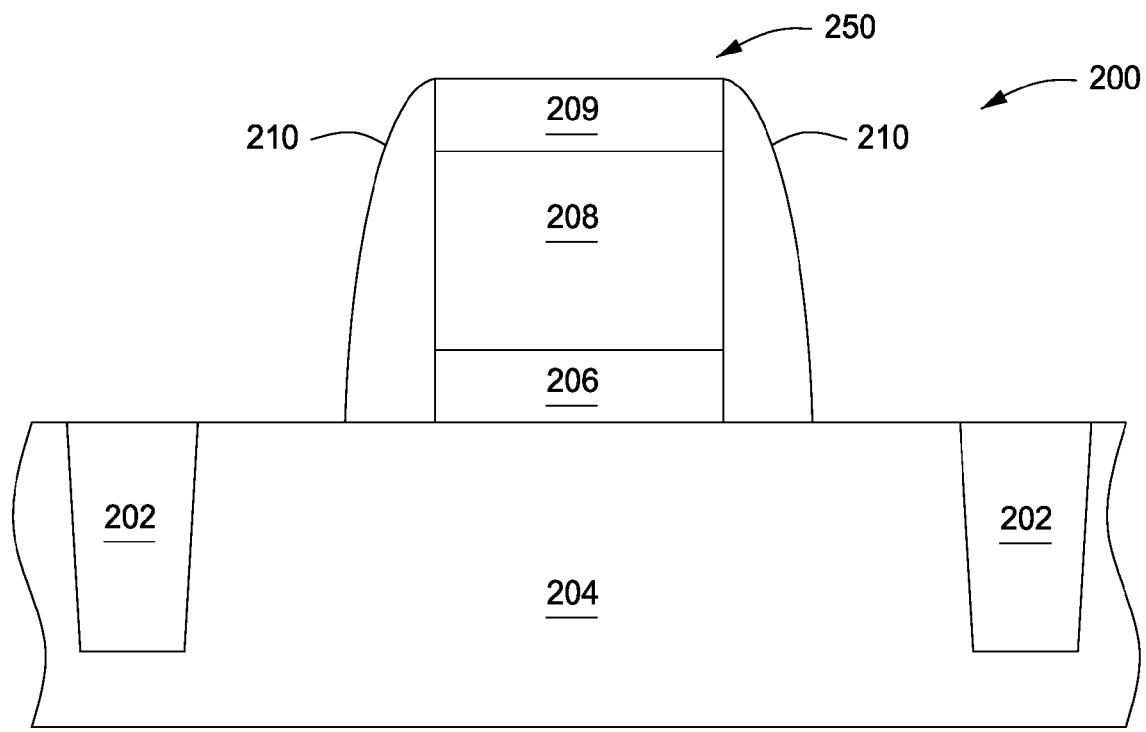
FIGS. 2A-F schematically depict exemplary stages of fabrication of a source/drain region in accordance with some embodiments of the method of FIG. 1.

The process 100 generally begins at 102, where a substrate 200 may be provided (as shown in FIG. 2A). The substrate 200 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. In some embodiments, the substrate 200 comprises silicon.

In some embodiments, the substrate 200 may include other structures or layers at least partially formed thereon. For example, as shown in FIG. 2A, the substrate 200 may include a p-type region 204 defined therein and having an n-type metal oxide semiconductor (NMOS) device 250 partially fabricated atop the p-type region 204. In some embodiments, such as where one or more transistors are being formed on the substrate 200, a plurality of field isolation regions 202 may be formed in the substrate 200 to isolate wells having different conductivity types (e.g., n-type or p-type) and/or to isolate adjacent transistors. The field isolation regions 202 may be shallow trench isolation (STI) structures formed, for example, by etching a trench into the substrate 200 and then filling the trench with a suitable insulator, such as silicon oxide (oxide), silicon nitride (nitride), or the like.

The p-type region 204 may be formed by one or more implant processes using a suitable dopant, such as boron, indium, or the like into the substrate 200. The p-type region 204 may also be formed by other means including providing an initially doped substrate, or depositing an in situ doped semiconductor material with a desired conductivity. The p-type region 204 may have a conductivity, for example, of between about $5\times10^{16}$ atoms/cm$^3$ and about $5\times10^{19}$ atoms/cm$^3$.

The partially fabricated NMOS device 250 may include a gate dielectric layer 206 formed on the substrate 200 atop the p-type region 204. The gate dielectric layer 206 may comprise, for example, one or more silicon oxide, silicon nitride, or silicon oxynitride layers, which, for example, may be deposited to a thickness between about 0.5 nm and about 20 nm. A gate electrode 208 may be formed on the gate dielectric layer 206. The gate electrode 208 may be formed from suitable conductive materials, such as metals, polysilicon, or the like. In some embodiments, the gate electrode may be between about 100 nm and about 350 nm thick. A hard mask layer 209 may be deposited atop the gate electrode 208 to protect the gate electrode 208 from the etching process described below.

Sidewall spacers 210 may be formed along the outer sidewalls of the hard mask layer 209, the gate electrode 208 and the gate dielectric layer 206. The sidewall spacers 210 may be formed, for example, to a thickness between about 5 nm and about 30 nm, or any other thickness suitable to electrically isolate the gate electrode 208 from subsequently deposited material. The sidewall spacers 210 may comprise suitable insulating materials, for example, silicon nitride, silicon oxide, silicon oxynitride, silicon carbide, or the like. The sidewall spacers 210 may be deposited by any suitable process, such as chemical vapor deposition, and may be formed such that outer edges of the sidewall spacers 210 taper near the topmost surface of the gate electrode and hard mask layer 209, as shown in FIG. 2A.

Figure 2B:
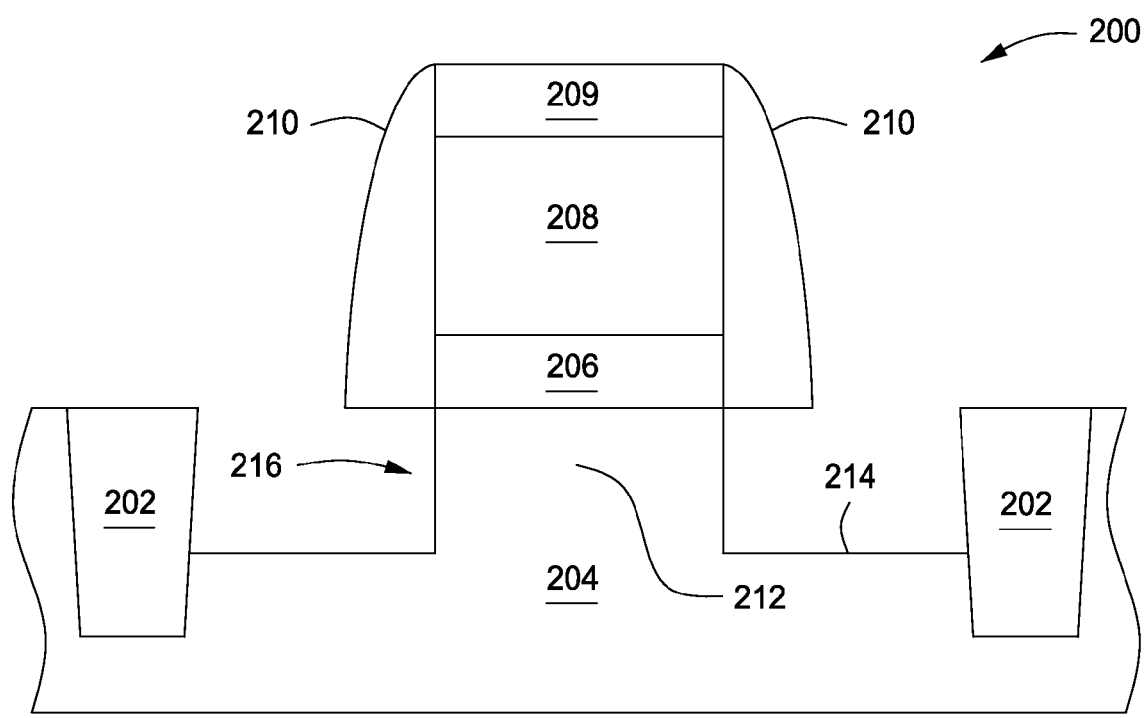

In some embodiments, for example, wherein the source/drain regions have not been defined in the substrate 200, the substrate 200 may be etched (as shown at 104 and in FIG. 2B). Specifically, the p-type region 204 of the substrate 200 may be etched to form source/drain regions 214 disposed on opposite sides of the gate electrode 208 and adjacent the sidewall spacers 210, thereby defining a channel 212 of the transistor therebetween. In embodiments where the substrate 200 is etched, the hard mask layer 209 protects the gate electrode 208 from being etched.

In some embodiments, the substrate 200 may be etched isotropically to form the source/drain regions 214 vertically into the p-type region 204. In some embodiments, and as shown in FIG. 2B, substrate 200 may be etched at least partially horizontally, or laterally (e.g., using an anisotropic etch process), to form the source/drain regions 214 both vertically into the p-type region 204 and extending horizontally beneath the sidewall spacers 210 and the gate dielectric layer 206. The horizontal etching facilitates producing source/drain recesses 216 in the substrate 200 that extend beneath the gate dielectric layer 206, as shown in FIG. 2B.

The source/drain regions 214 (and optionally source/drain recesses 216) may have a substantially vertical sidewall and substantially flat, horizontal bottom of the source/drain regions 214, as shown in FIG. 2B. Alternatively, the source/drain regions 214 (and optionally, the source/drain recesses 216) may have a concave shape (not shown) or other desired geometry. The source/drain areas 214 (and optionally source/drain recesses 216) may have any suitable dimensions, for example, a depth of between about 5 nm and about 150 nm, and a width that may be as large as a distance between the isolation structure 202 to the gate dielectric 206, or less as necessary (such as, for example, between about 25 and about 2500 nm).

In some embodiments, the source/drain regions 214 (and optionally source/drain recesses 216) may be cleaned to remove etchant materials and/or annealed to repair damaged surfaces of the source/drain regions 214 (and optionally source/drain recesses 216) prior to the deposition of source/drain materials as described below. The cleaning and/or annealing process may be any suitable process capable of removing etchant materials and/or repairing damaged surfaces of source/drain regions 214 (and optionally source/drain recesses 216). For example, and in some embodiments, the cleaning process may be a low temperature bake (e.g., within a suitable process chamber, such as described below) in the presence of a hydrogen-containing gas, such as hydrogen ($H_2$) or the like. In some embodiments, the process gas is hydrogen ($H_2$).

The temperature and pressure within the process chamber may be regulated during the cleaning process to maintain an environment suitable for cleaning process.

In embodiments where the surfaces of the source/drain regions 214 and, optionally, source/drain recesses 216, may be damaged by the etching process, an anneal may be performed to the repair the surfaces. For example, and in some embodiments, the annealing process may be a high temperature bake or rapid thermal process (RTP) (e.g., within a suitable chamber, such as described below). In some embodiments, the annealing process may include the same process gases and concentrations thereof as described above for the cleaning process.

The temperature and pressure within the process chamber may be regulated during the annealing process to maintain an environment suitable for the annealing process.

Figure 2C:
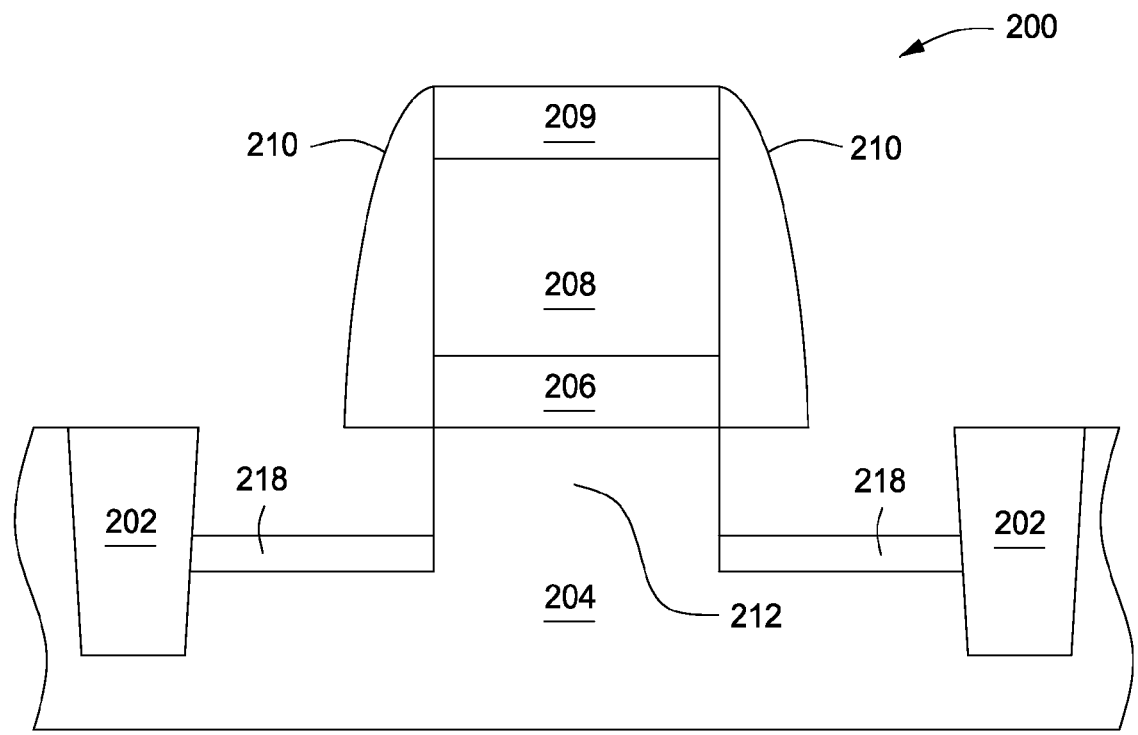
Figure 2D:
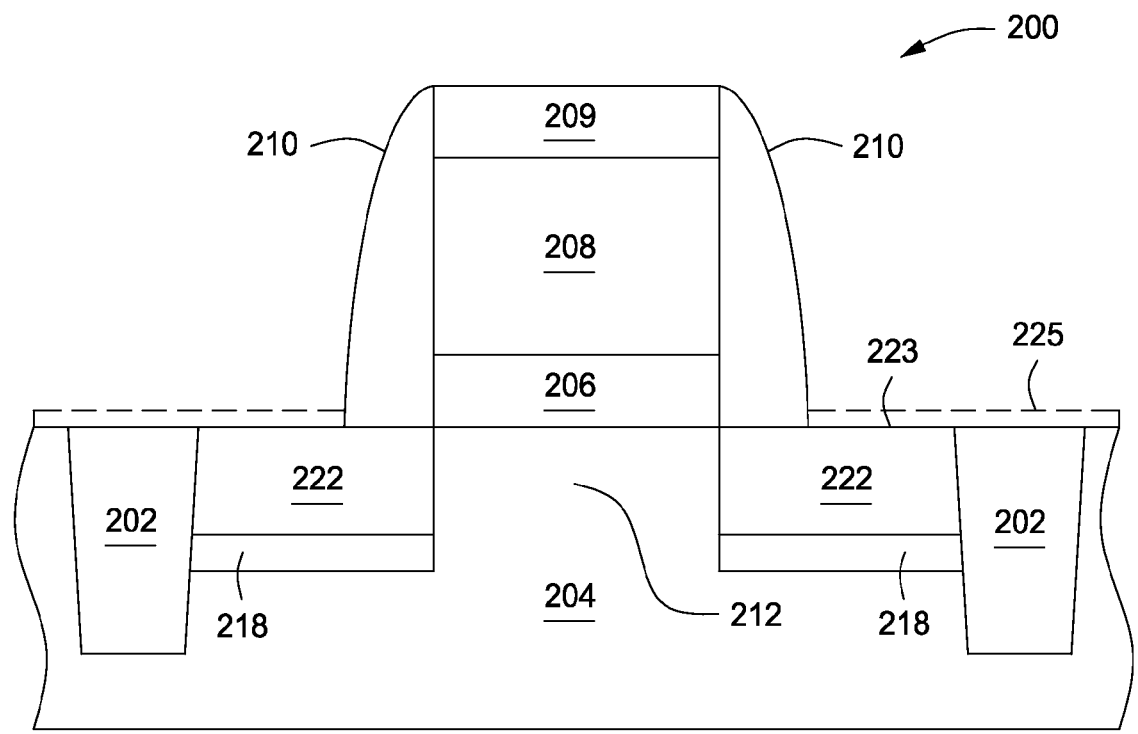

Next, at 104, a silicon seed layer 218 may be deposited on the substrate 200 within the source/drain regions 214 and the source/drain recesses 216 (as shown in FIG. 2C). The silicon seed layer 218 may be deposited within the source/drain regions 214 and, when present, the source/drain recesses 216. The silicon seed layer 218 may be formed to a suitable thickness to provide uniform coverage. In some embodiments, the silicon seed layer 218 may be formed to a thickness of between about 50 to about 100 Angstroms.

The silicon seed layer 218 may be deposited by any suitable process, such as by epitaxial growth of the silicon seed layer. For example, in some embodiments, the silicon seed layer 218 may be epitaxially grown (e.g., within a suitable process chamber, such as described below) by providing a first process gas mixture comprising a silicon-containing gas and, optionally, a carrier gas.

The silicon-containing gas may include, but is not limited to, one or more of silanes, halogenated silanes, and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X_y'Si_xH_{(2x+2-y)}$, where $X' = $F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$).

The carrier gas may include nitrogen ($N_2$), hydrogen ($H_2$), argon, helium, and combinations thereof. A carrier gas may be selected based the identity of the silicon-containing gas and/or the process temperature during the epitaxial process.

The first process gas mixture for the deposition of the silicon seed layer 218 may be supplied at any suitable gas flow and may utilize a range of compositions, for example, such as any suitable percent compositions and/or flow rates of the silicon-containing gas and the carrier gas.

The temperature and pressure within the process chamber may be regulated during processing to maintain an environment suitable for the deposition of the silicon seed layer 218.

Next, at 106, a silicon-containing bulk layer (e.g., silicon-containing bulk layer 222 depicted in FIG. 2D) may be deposited atop the silicon seed layer 218 in the source/drain region 214 and, when present, the source/drain recess 216. The thickness of the silicon-containing bulk layer 222 may vary as required to fill the source/drain regions 214 and, when present, the source/drain recesses 216.

The silicon-containing bulk layer 222 may comprise silicon, silicon and a lattice adjusting element, or silicon and an n-type dopant element. For example, the lattice adjusting element may include carbon or the like. In some embodiments, the lattice adjusting element is carbon. The n-type dopant element may include phosphorus, arsenic, or the like. In some embodiments, the n-type dopant element is phosphorus.

For example, and in some embodiments, the silicon-containing bulk layer 222 may be epitaxially grown (e.g., within a suitable process chamber, such as described below) by providing a second process gas mixture comprising a silicon-containing gas, or a silicon-containing gas and either a lattice adjusting element-containing gas or an n-type dopant element-containing gas. Optionally, the second process gas mixture may further comprise a carrier gas. The silicon-containing gas may comprise any one or more of the silicon containing gases disclosed above for depositing the silicon seed layer.

The lattice adjusting element-containing gas may include, but is not limited to, a carbon source such as one or more of organosilanes, alkyls, alkenes and alkynes of ethyl, propyl and butyl. Such carbon sources include methylsilane ($CH_3SiH_3$), dimethylsilane (($CH_3$)$_2SiH_2$), trimethylsilane (($CH_3$)$_3SiH$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others.

The n-type dopant-containing gas may comprise at least one of arsine ($AsH_3$), phosphine ($PH_3$) or alkylphosphines, such as with the empirical formula $R_xPH_{(3-x)}$, where R=methyl, ethyl, propyl or butyl and x=1, 2 or 3. Alkylphosphines may include trimethylphosphine (($CH_3$)$_3P$), dimethylphosphine (($CH_3$)$_2PH$), triethylphosphine (($CH_3CH_2$)$_3P$), diethylphosphine (($CH_3CH_2$)$_2PH$), or the like.

The carrier gas may comprise any of the carrier gases disclosed above for depositing the silicon seed layer. The second process gas mixture for the deposition of the silicon-containing bulk layer 222 comprising silicon may be supplied at any suitable gas flow and may utilize a range of compositions, for example, such as any suitable percent compositions and/or flow rates of any of the silicon-containing gas, the lattice adjusting element-containing gas, n-type dopant-containing gas or the carrier gas.

At 110, and in some embodiments, the silicon-containing bulk layer 222 comprises silicon and the lattice adjusting element. In some embodiments, the lattice adjusting element may comprise carbon, thereby forming a silicon-carbon film. The silicon-containing bulk layer 222 having the lattice adjusting element may facilitate providing an increased strain in the source/drain regions 214 and, when present, the source/drain recesses 216, thereby advantageously increasing the strain in the channel 212 of the transistor.

In some embodiments, for example at 112, the silicon-containing bulk layer 222 comprises silicon and the n-type dopant element. In some embodiments, the n-type dopant element may comprise phosphorus, thereby forming a silicon-phosphorus film. The silicon-containing bulk layer 222 having the n-type dopant element may facilitate providing a low junction series resistance in the source/drain regions 214 and, when present, the source/drain recesses 216, thereby advantageously reducing junction series resistance in the NMOS transistor device.

The temperature and pressure within the process chamber may be regulated during processing to maintain an environment suitable for the deposition of the silicon-containing bulk layer 222.

Figure 2E:
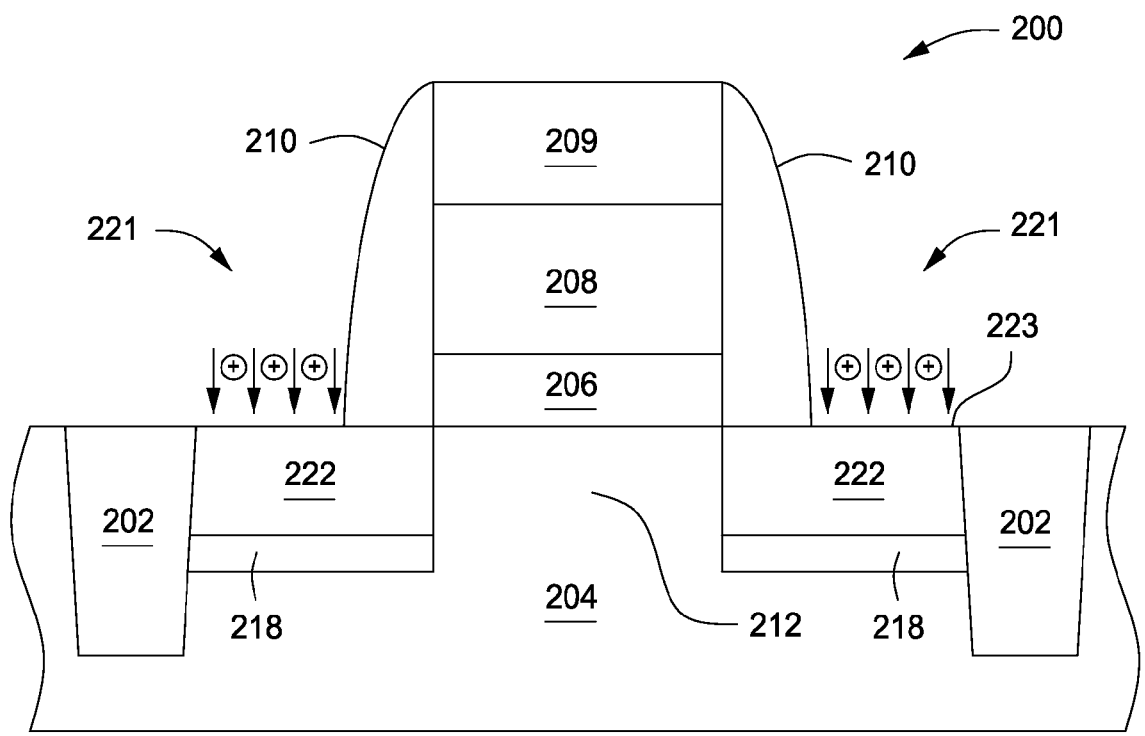

Next, at 114, missing elements 221 (i.e., the lattice adjusting element, the n-type dopant element, or both) from the silicon-containing bulk layer 222 may be implanted into the silicon-containing bulk layer 222 as depicted in FIG. 2E. For example, if the silicon-containing bulk layer 222 is just silicon, then a lattice adjusting element and an n-type dopant may be implanted; if the silicon-containing bulk layer 222 is silicon and a lattice adjusting element, then an n-type dopant may be implanted; and if the if the silicon-containing bulk layer 222 is silicon and an n-type dopant, then a lattice adjusting element may be implanted. The elements may be implanted by any suitable process, such as plasma immersion ion implantation of the missing elements 221 into the silicon-containing bulk layer 222. Plasma immersion ion implantation may advantageously limit the damage that implanted plasma ions may cause in the silicon seed layer 218, and further limit amorphization in and below the silicon-containing bulk layer 222.

For example, in some embodiments, the missing elements 221 from the silicon-containing bulk layer 222 may be implanted (e.g., within a suitable process chamber, such as described below) by forming a plasma from a third process gas mixture comprising at least one of a lattice adjusting element-containing gas or a n-type dopant element-containing gas, and, optionally, a carrier gas. The lattice adjusting element-containing gas may comprise any of the lattice adjusting element-containing gases disclosed above. The n-type dopant element-containing gas may comprise any of the n-type dopant gases disclosed above. The carrier gas may comprise any of the carrier gases disclosed above.

The third process gas mixture may be supplied at any suitable gas flow and may utilize a range of compositions, for example, such as any suitable percent compositions and/or flow rates of any of the lattice adjusting element-containing gas, n-type dopant-containing gas or the carrier gas.

For example, at 116, in some embodiments where the silicon-containing bulk layer 222 comprises silicon, both a lattice adjusting element and an n-type dopant element may be implanted by forming a plasma from an third process gas mixture comprising an n-type dopant element-containing gas, a lattice adjusting element containing gas, and a carrier gas.

For example, at 118, in some embodiments where the silicon-containing bulk layer 222 comprises silicon and a lattice adjusting element, an n-type dopant element may be implanted by forming a plasma from an third process gas mixture comprising an n-type dopant element-containing gas, and a carrier gas.

For example, at 120, in some embodiments where the silicon-containing bulk layer 222 comprises silicon and an n-type dopant element, a lattice adjusting element may be implanted by forming a plasma from an third process gas mixture comprising a lattice adjusting element containing gas, and a carrier gas.

A plasma may be generated from the third process gas mixture described above at 108 to implant at least one of the lattice adjusting element or the n-type dopant element into the silicon-containing bulk layer 222 as shown in FIG. 2E. The plasma may be formed in a process chamber using a remote plasma source. Alternatively, other suitable chambers are contemplated, for example, wherein the plasma is pulsed. One such exemplary chamber wherein the plasma is generated remotely is a toroidal source plasma ion immersion implantation reactor described below with respect to FIG. 4.

The plasma may be formed by applying a source power at suitable frequency to form a plasma (for example, in the MHz or GHz range). The plasma may be formed remotely, or optionally, pulsed during implantation.

The substrate 200 may be biased during implantation to control the flux of ions to the silicon-containing bulk layer 222, and, in some embodiments, to control the depth of ion penetration into the layer 222.

The plasma may be formed in a low pressure process, thereby reducing the likelihood of contamination induced defects in the silicon seed layer 218 and/or amorphization of the silicon-containing bulk layer 222. For example, in some embodiments, the ion implantation may be performed at a pressure of between about 1-about 500 mTorr. Moreover, ion bombardment-induced defects that would be expected at such low pressure levels may be limited or prevented by using a remote plasma source as described below with respect to FIG. 5 or, optionally, by pulsing the plasma source power.

Optionally, prior to implantation of missing elements, a silicon oxide layer (layer 225 depicted in phantom in FIG. 2D) may be deposited atop the silicon-containing layer 222. The silicon oxide layer 225 may be deposited by any suitable means, for example, such as epitaxially grown after deposition of the silicon-containing bulk layer 222 at 106. The silicon oxide layer may advantageously allow for implantation at increased plasma density or increase plasma flux which may smooth the surface 223 of the silicon-containing bulk layer 222 at the interface of the silicon oxide layer (not shown). Further, the silicon oxide layer may permit deeper penetration of elements (i.e., lattice adjusting elements or n-type dopant elements) into the silicon-containing layer 222 while preventing damage or defect formation in the silicon seed layer 218 caused by ion implantation. The silicon oxide layer may be removed before or after annealing at 110.

Figure 2F:
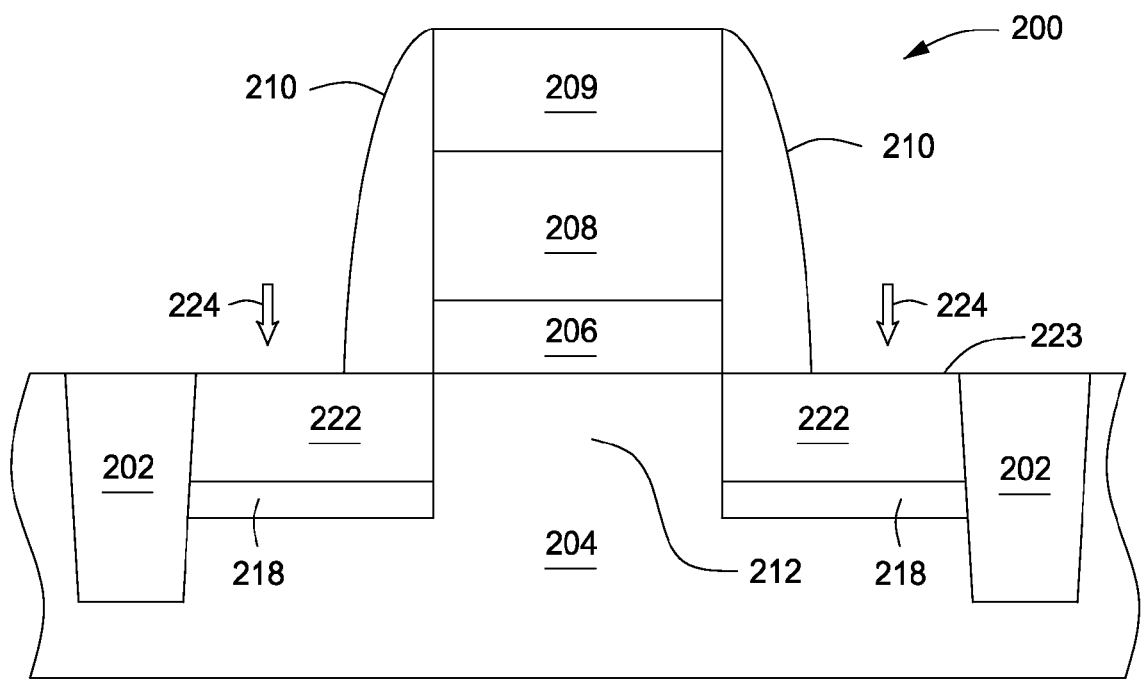

Next, at 122, at least portions of the substrate 200 including the silicon-containing layer 222 may be annealed with a laser (or other focused energy source) in the presence of a process gas comprising hydrogen to heal and/or remove defects and/or contaminants in the substrate 200 and/or silicon-containing bulk layer 222 (as depicted in FIG. 2F) The entire surface of the substrate 200 may be annealed, or only selected portions of the surface of the substrate 200 including the silicon-containing bulk layer 222 may be annealed. The annealing process in a hydrogen atmosphere facilitates re-crystallization of the silicon-containing bulk layer 222, which may have been amorphized during ion implantation at 114. The silicon seed layer 218 may act as a template for re-crystallization during the annealing process. The anneal process further facilitates healing surface defects, for example by localized heating and silicon migration, and/or removing contaminants, for example by silicon-oxygen sublimation and carbon desorption, without the thermal budget issues arising in thermal bake processes. Further, the annealing process facilitates activation of the n-type dopant elements. As illustrated in FIG. 2F, the anneal comprises scanning at least a portion of the substrate 200 with a beam 224 of radiation emitted by a laser (e.g., a laser beam or other focused beam of energy) in the presence of at least one ambient gas. The annealing operates to re-crystallize the silicon-containing bulk layer 222 and heal and/or remove any defects and/or to remove any contaminants present on or proximate the surface of the substrate 200. The substrate 200 may be annealed in a focused beam annealing chamber as described below with respect to FIG. 5, or other suitable chamber.

In some embodiments, selected portions of the surface or the entire surface of the substrate 200 may be annealed with the beam 224 by sequentially scanning the beam 224 over the substrate surface. In some embodiments, the scanning may be continuous, for example, the beam 224 may traverse the substrate surface without pause at any portion of the surface being annealed. In some embodiments, the rate at which the laser beam is scanned across the surface may be between about 10 mm/sec and about 100 mm/sec. In some embodiments, the scanning may be stepwise, for example, the beam 224 may be positioned over a first portion of the substrate surface for a desired first period of time, and then moved to a second portion of the substrate surface and held above the second portion for a desired second period of time. Each successive period of time (e.g., the first period, the second period, and so on) may be the same or different. In some embodiments, the beam 224 may irradiate a particular portion of the substrate surface for a time ranging between about 1 msec to about 10 seconds.

The beam 224 may be of appropriate dimensions, such that the surface area of the portion of the substrate surface radiated at any instant may be between about 100 $\mu m^2$ to 100 $mm^2$. It is contemplated that the dimensions of the energy beam 224 can be adjusted relative to, for example, the average size of an ion dopant region (i.e., the size of a source/drain region 214) or other such feature disposed in the substrate 200.

In some embodiments, the beam 224 may have a wavelength or a combination of wavelengths ranging from about 150 to about 1100 nanometers. The wavelength of the beam 224 may be selected based on the identity and subsequent absorption properties of the substrate 200. For instance, the wavelength can be selected such that it is not absorbed strongly by the substrate, thereby limiting significant increases in substrate temperature (either locally proximate the beam 224 or universally in the bulk). In some embodiments, the absorption coefficient (also referred to as the extinction coefficient, molecular extinction coefficient, absorption cross section, or the like) of the substrate 200 or silicon-containing bulk layer 222 utilized with the above wavelength range may be between about 20 to about 200 Å. Further, the weakly absorbing nature of the substrate material or silicon-containing bulk layer material may limit depth of temperature increase due to irradiation by the beam 224 to proximate the substrate surface. In some embodiments, the substrate may be heated to a depth of about 50 Å or less (thereby facilitating annealing to a depth of about 50 Å or less). In some embodiments, the silicon-containing layer 222 may be heated to a depth of about 400 Å (thereby facilitating annealing to a depth of about 400 Å or less). Further, it is contemplated that the intensity of the laser source may be adjusted to control the temperature or depth of the portion of the substrate being annealed. For example, in some embodiments, multiple passes over the same portion of the substrate at a lower intensity may provide the same depth and effectiveness of treatment, or a deeper total depth of treatment, without increasing the bulk temperature of the substrate.

The beam 224 may be supplied in either a continuous or pulsed beam. The beam 206 may be provided either continuously or pulsed during annealing of an entire substrate. Alternatively, in some embodiments, the beam may be provided continuously over some portions of the substrate and pulsed over other portions of the substrate.

In some embodiments, a continuous beam may be selected if the material being annealed is weakly absorbing, and thus may require more input radiation to achieve the temperature necessary to promote re-crystallization or heal defects or remove contaminants. In some embodiments, a continuous beam may be selected to rapidly achieve a desired temperature at each portion of the substrate being annealed, such that maximum throughput can be maintained while still maintaining a reduced thermal budget for each substrate and limiting dopant diffusion in each substrate. In some embodiments, a continuous beam may be provided at an intensity or power of between about 10 $kW/cm^2$ to about 100 $kW/cm^2$.

In some embodiments, a pulsed beam may be selected if the material of the substrate being annealed is strongly absorbing, and thus may require less input radiation to achieve the temperature necessary to heal defects or remove contaminants. This input radiation may be delivered over a much shorter time period or pulse duration than a time period required for heat to be dispersed over the bulk material. In embodiments where the beam 224 is pulsed, each pulse of the beam 224 may be provided to a different location on the substrate 200 (e.g., provide pulse then move laser beam to new location), or a plurality of pulses may be provided to a particular location prior to moving the laser beam to a new location over the substrate 200. In some embodiments, the laser beam may return to a particular location of the substrate 200 that has been previously subjected to the beam 224 to provide an additional pulse or pulses (for example to allow the substrate to locally cool while still annealing a different portion of the substrate).

The energy delivered by each pulse to a portion of the substrate may be adjusted in accordance with the identity of the substrate material, or the condition thereof, by varying at least one of the laser wavelength, pulse duration, or beam diameter. In some embodiments, the energy delivered by each pulse is between about 20 $mJ/cm^2$ to about 2000 $mJ/cm^2$. In some embodiments, the pulse duration is between about 100 femtosecond to 100 nanosecond. In some embodiments, the beam diameter is between about 10-10000 $\mu m$.

Each pulse may include a period during which the beam 224 is on (a first period) and a period during which the beam 224 is off (a second period). The first and second periods together define a total pulse period, or frequency. In some embodiments, a frequency between each pulse (e.g., the time between which consecutive pulses reach the surface of the substrate) may range between about 1 Hz to about 100 Hz. The pulse frequency may be adjusted to control at least one of the temperature or the depth of the portion of the substrate being annealed. In some embodiments, the total number of pulses applied for the treatment may be varied in accordance with initial conditions of the substrate. Initial conditions of the substrate may include, for example, pre-steps or history, defect density, surface roughness, identity and concentration of contaminants, identity of the substrate material, and the like.

In some embodiments, the pulse energy may be varied between pulses applied to the portion of the substrate being anneal. In some embodiments, the pulse energy is varied uniformly between the initial and final pulses applied to the portion of the substrate being annealed. It is further contemplated that the pulse energy can be varied using any suitable profile such as to reduce defect density, reduce surface roughness, remove contaminants, or the like. In one specific embodiment, the pulse energy is varied between the initial and final pulse to reduce roughness of the substrate surface, for example, from >10 Å RMS roughness to a roughness of about 1 Å RMS or less.

In some embodiments, the portion of the substrate being annealed may reach temperatures ranging between about 700 to about 1200 degrees Celsius. The temperature of the bulk of the substrate 200 (e.g., portions at least 50 Å below the surface) and in portions of the substrate 200 not being radiated by the beam 224 may be maintained between about 50 to about 300 degrees Celsius.

The anneal described above is performed in the presence of a process gas including hydrogen. In some embodiments, the process gas may further include one or more inert gases, such as helium, nitrogen, argon, or the like.

In some embodiments, the process gas for the annealing process may be supplied at a total gas flow from about 100 to 1000 sccm, or, in some embodiments, from about 1000 to 10000 sccm. The process gas may utilize a range of compositions. In one embodiment, the process gas may comprise between about 5 to 100 percent of the hydrogen gas. In one embodiment, the process gas may comprise between about up to about 95 percent of the inert gas. In one specific embodiment, hydrogen is provided at a rate of between about 5000 to 9000 sccm and argon is provided at a rate of between about 1000 to 5000 sccm. In some embodiments, the anneal may be performed at an ambient pressure in the annealing chamber ranging from between about 1 Torr to about 700 Torr.

The anneal process described above may continue until an entire substrate, or at least portions thereof, are treated to re-crystallize the silicon-containing layer 222 after ion implantation at 114, heal any defects or remove any contaminants as desired. Upon completion of the anneal at 122, the method generally ends, and additional fabrication steps may be performed to complete fabrication of the structure or device being formed. For example, further fabrication steps may include depositing a second set of sidewall spacers (not shown) to further isolate the gate electrode 208 from the source/drain region. The source/drain region comprises those regions formed by the deposition of the silicon seed layer 218 and the silicon-containing bulk layer 222. The second set of sidewall spacers may be deposited by the same process and same materials as described for sidewall spacers 210. The source/drain region may be etched prior to the deposition of the second set of sidewall spacers to provide sufficient isolation for the gate electrode 208.

In some embodiments, an optional fabrication step (not shown) may involve a salicidation process to form a low resistance silicide atop the annealed silicon-containing bulk layer 222. The silicide formation process may be one conventionally known in the art, such as cobalt and titanium nitride deposition and anneal to form a cobalt silicide. Other materials, such as nickel for nickel silicide, and other metals suitable for silicide formation may be used to form the silicide herein. Optionally, when a silicon oxide layer is used during ion implantation as described above, the silicon oxide layer may be removed prior to silicide formation.

Although the methods described herein are related to NMOS transistor devices, the methods may be applied to PMOS devices. For example, in a PMOS source/drain layer, a silicon seed layer may be deposited in the source/drain region of a PMOS device, or optionally, in the source/drain recesses or etch recess of a gate electrode where present. A silicon-containing bulk layer comprising silicon, silicon and a lattice adjusting element, or silicon and a p-type dopant element may be deposited atop the silicon seed layer. For example, the lattice adjusting element for a PMOS device may be germanium (Ge) and a p-type dopant element may be boron (B). Similar to method steps described above, missing elements in the silicon-containing bulk layer (i.e., the lattice adjusting element, the p-type dopant or both) may be implanted in the silicon-containing bulk layer by ion implantation, and the silicon-containing bulk layer may be annealed to re-crystallize the silicon-containing bulk layer.

The method 100 described above may be performed in any suitable process chambers for deposition and ion implantation such as those described below with respect to FIGS. 3-4, respectively. In addition, annealing may be performed in any suitable chamber for focused beam annealing such as that described below with respect to FIG. 5. One example of a suitable deposition chamber is the RP EPI® process chamber, available from Applied Materials, Inc. of Santa Clara, Calif. Other suitable layer deposition chambers may be utilized such as chemical vapor deposition chambers, physical vapor deposition chambers, or the like. One example of a suitable ion implantation chamber is the P3I® process chamber, available from Applied Materials, Inc. of Santa Clara, Calif. One example of a suitable focused beam annealing chamber is the DSA® process chamber, available from Applied Materials, Inc. of Santa Clara, Calif. These process chambers may be utilized individually, or may be part of a cluster tool, such as one of the CENTURA® line of cluster tools, also available from Applied Materials, Inc. Integrating both the focused beam anneal chamber and the layer deposition chamber on a single platform (e.g., the cluster tool) may advantageously prevent re-contamination of the annealed substrate during the exchange of the substrate between chambers. An example of a suitable cluster tool is described below with respect to FIG. 6.

The inventive deposition processes disclosed herein may be performed in any suitable semiconductor process chamber adapted for performing epitaxial silicon deposition processes, such as the RP EPI® reactor, available from Applied Materials, Inc. of Santa Clara, Calif. An exemplary process chamber is described below with respect to FIG. 3, which depicts a schematic, cross-sectional view of a semiconductor substrate process chamber 300 suitable for performing portions of the present invention. The process chamber 300 may be adapted for performing epitaxial silicon deposition processes as discussed above and illustratively comprises a chamber body 310, support systems 330, and a controller 340.

The chamber body 310 generally includes an upper portion 302, a lower portion 304, and an enclosure 320. The upper portion 302 is disposed on the lower portion 304 and includes a lid 306, a clamp ring 308, a liner 316, a baseplate 312, one or more upper lamps 336 and one or more lower lamps 338, and an upper pyrometer 356. In one embodiment, the lid 306 has a dome-like form factor, however, lids having other form factors (e.g., flat or reversecurve lids) are also contemplated. The lower portion 304 is coupled to a process gas intake port 314 and an exhaust port 318 and comprises a baseplate assembly 321, a lower dome 332, a substrate support 324, a pre-heat ring 322, a substrate lift assembly 360, a substrate support assembly 364, one or more upper lamps 352 and one or more lower lamps 354, and a lower pyrometer 358. Although the term "ring" is used to describe certain components of the process chamber, such as the pre-heat ring 322, it is contemplated that the shape of these components need not be circular and may include any shape, including but not limited to, rectangles, polygons, ovals, and the like.

During processing, a substrate 325 is disposed on the substrate support 324. The lamps 336, 338, 352, and 354 are sources of infrared (IR) radiation (i.e., heat) and, in operation, generate a pre-determined temperature distribution across the substrate 325. The lid 306, the clamp ring 316, and the lower dome 332 are formed from quartz; however, other IR-transparent and process compatible materials may also be used to form these components.

The substrate support assembly 364 generally includes a support bracket 334 having a plurality of support pins 366 coupled to the substrate support 324. The substrate lift assembly 360 comprises a substrate lift shaft 326 and a plurality of lift pin modules 361 selectively resting on respective pads 327 of the substrate lift shaft 326. In one embodiment, a lift pin module 361 comprising an optional upper portion of the lift pin 328 is movably disposed through a first opening 362 in the substrate support 324. In operation, the substrate lift shaft 326 is moved to engage the lift pins 328. When engaged, the lift pins 328 may raise the substrate 325 above the substrate support 324 or lower the substrate 325 onto the substrate support 324.

The support systems 330 include components used to execute and monitor pre-determined processes (e.g., growing epitaxial silicon films) in the process chamber 300. Such components generally include various sub-systems. (e.g., gas panel(s), gas distribution conduits, vacuum and exhaust sub-systems, and the like) and devices (e.g., power supplies, process control instruments, and the like) of the process chamber 300. These components are well known to those skilled in the art and are omitted from the drawings for clarity.

Figure 3:
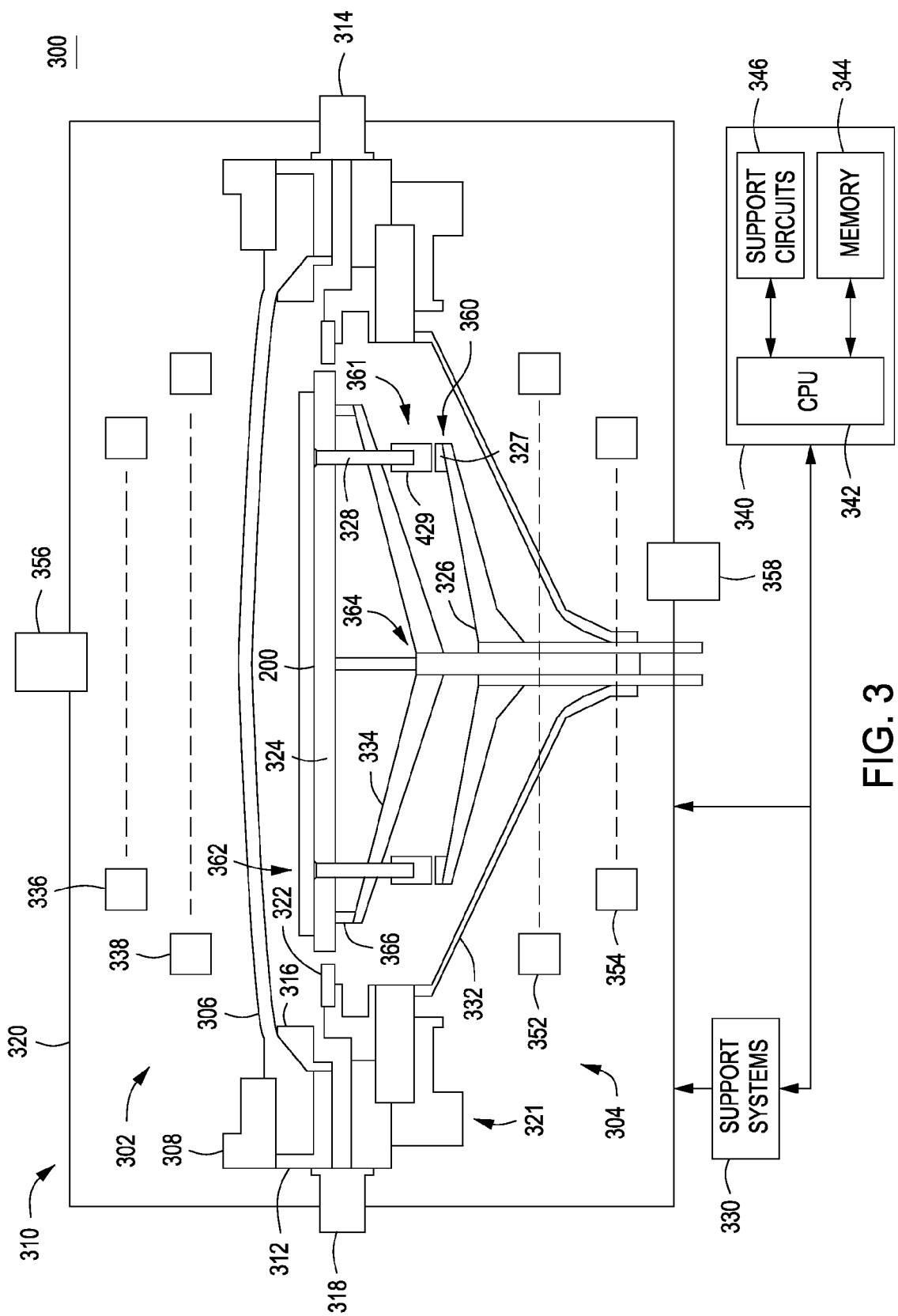
FIG. 3 depicts a schematic, cross-sectional view of a semiconductor substrate process chamber suitable for performing portions of the present invention.

The controller 340 generally comprises a central processing unit (CPU) 342, a memory 344, and support circuits 346 and is coupled to and controls the process chamber 300 and support systems 330, directly (as shown in FIG. 3) or, alternatively, via computers (or controllers) associated with the process chamber and/or the support systems.

Embodiments of the present invention may be performed in toroidal source plasma ion immersion implantation reactor such as, but not limited to, the Applied Materials, Inc., P3I® reactor. Such a suitable reactor and its method of operation are set forth in U.S. Pat. No. 7,166,524, assigned to the assignee of the invention, and which is incorporated herein by reference.

Figure 4:
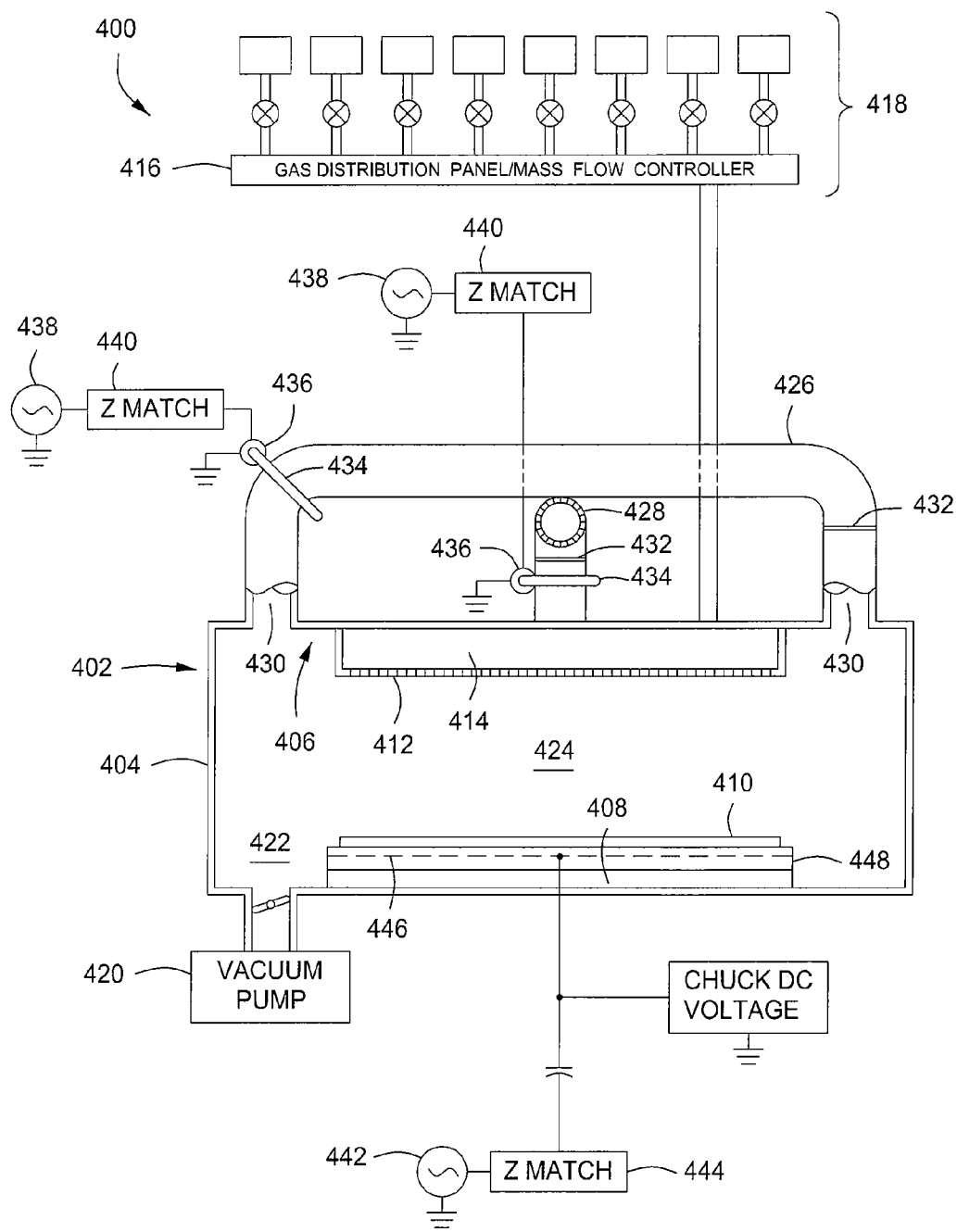
FIG. 4 depicts a schematic, cross-sectional view of a semiconductor substrate process chamber suitable for performing portions of the present invention.

Referring to FIG. 4, a toroidal source plasma immersion ion implantation ("P3i") reactor 400 of the type disclosed in the above-reference application has a cylindrical vacuum chamber 402 defined by a cylindrical side wall 404 and a disk-shaped ceiling 406. A substrate support pedestal 408 at the floor of the chamber supports a substrate 410 (e.g., substrate 402 with film stack 440 disposed thereon) to be processed. A gas distribution plate or showerhead 412 on the ceiling 406 receives process gas in its gas manifold 414 from a gas distribution panel 416 whose gas output can be any one of or mixtures of gases from one or more individual gas supplies 418. A vacuum pump 420 is coupled to a pumping annulus 422 defined between the substrate support pedestal 408 and the sidewall 404. A process region 424 is defined between the substrate 410 and the gas distribution plate 412.

Pair of external reentrant conduits 426, 428 establishes reentrant toroidal paths for plasma currents passing through the process region, the toroidal paths intersecting in the process region 424. Each of the conduits 426, 428 has a pair of ends 430 coupled to opposite sides of the chamber. Each conduit 426, 428 is a hollow conductive tube. Each conduit 426, 428 has a D.C. insulation ring 432 preventing the formation of a closed loop conductive path between the two ends of the conduit.

An annular portion of each conduit 426, 428, is surrounded by an annular magnetic core 434. An excitation coil 436 surrounding the core 434 is coupled to an RF power source 438 through an impedance match device 440. The two RF power sources 438 coupled to respective ones of the cores 436 may be of two slightly different frequencies. The RF power coupled from the RF power generators 438 produces plasma ion currents in closed toroidal paths extending through the respective conduit 426, 428 and through the process region 424. These ion currents oscillate at the frequency of the respective RF power source 426, 428. Bias power is applied to the substrate support pedestal 408 by a bias power generator 442 through an impedance match circuit 444.

Plasma formation and subsequent oxide layer formation is performed by introducing a process gas, or mixture of process gases into the chamber 424 through the gas distribution plate 412 and applying sufficient source power from the generators 438 to the reentrant conduits 426, 428 to create toroidal plasma currents in the conduits and in the process region 424. The plasma flux proximate the wafer surface is determined by the wafer bias voltage applied by the RF bias power generator 442. The plasma rate or flux (number of ions sampling the wafer surface per square cm per second) is determined by the plasma density, which is controlled by the level of RF power applied by the RF source power generators 438. The cumulative ion dose (ions/square cm) at the wafer 410 is determined by both the flux and the total time over which the flux is maintained.

If the wafer support pedestal 408 is an electrostatic chuck, then a buried electrode 446 is provided within an insulating plate 448 of the wafer support pedestal, and the buried electrode 446 is coupled to the bias power generator 442 through the impedance match circuit 444.

In operation, and for example, the selective formation of an oxide layer on the substrate 410 is achieved by placing the substrate 410 on the substrate support pedestal 408, introducing one or more process gases into the chamber 402 and striking a plasma from the process gases.

In operation, a plasma may be generated from the process gases within the reactor 400 to selectively form an oxide layer on the substrate 410. The plasma is formed in the process region 424 by applying sufficient source power from the generators 438 to the reentrant conduits 426, 428 to create plasma ion currents in the conduits 426, 428 and in the process region 424 in accordance with the process described above. In some embodiments, the wafer bias voltage delivered by the RF bias power generator 442 can be adjusted to control the flux of ions to the wafer surface, and possibly the thickness of the oxide layer formed. In some embodiments, no bias power is applied.

Embodiments of the present invention may be performed in dynamic surface annealing (DSA) (e.g., focused beam annealing, or laser annealing) chamber such as, but not limited to, the Applied Materials, Inc., DSA® chamber. Such a suitable chamber and its method of operation are set forth in U.S. Pat. No. 7,005,061, assigned to the assignee of the invention, and which is incorporated herein by reference.

Figure 5:
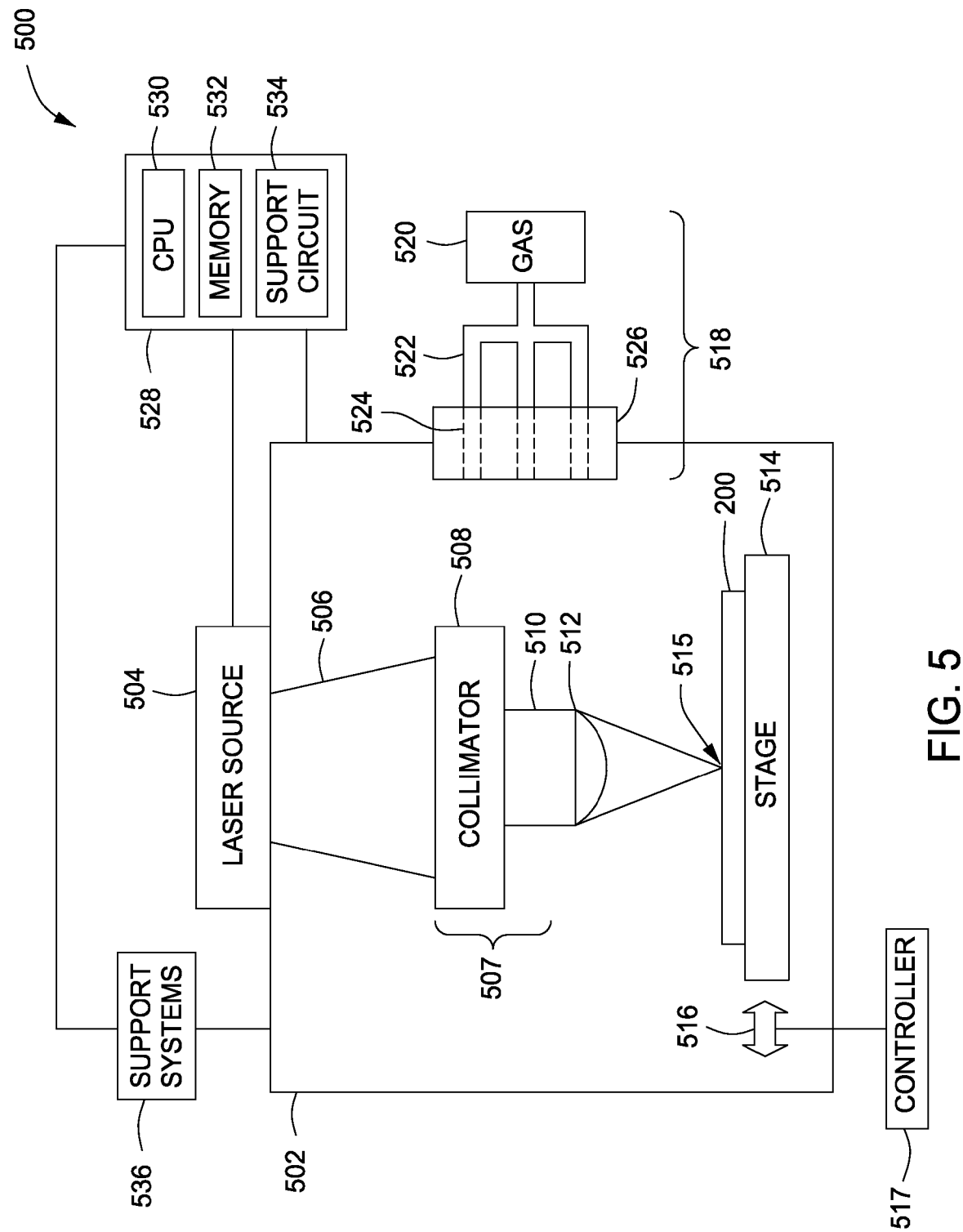
FIG. 5 depicts a schematic, cross-sectional view of a semiconductor substrate process chamber suitable for performing portions of the present invention.

FIG. 5 depicts a focused beam annealing chamber 500 suitable for performing annealing processes of the present invention, such as described above. The focused beam annealing chamber 500 comprises a reaction chamber 502, a gas injector 518 used to introduce one or more gases into the reaction chamber 502, an energy source 504 (such as a laser source), a stage 514 configured to receive a substrate thereon, and a translation mechanism 516. In embodiments of the present invention, the energy source 504 comprises at least a continuous wave electromagnetic radiation source or a pulsed electromagnetic radiation source. Focusing optics 507 may be disposed between the energy source 504 and the stage 514. In some variants of the focused beam annealing chamber 500, the energy source 504 and focusing optics 507 may be placed outside of the chamber where radiation passes into the chamber via a transparent window (not shown).

In some embodiments, the energy source 504 may comprise multiple laser diodes, each of which produces substantially uniform and spatially coherent light at the same wavelength. The power of the laser diodes may range from 0.5 kW to 50 kW. Suitable laser diodes are made by Coherent Inc. of Santa Clara, Calif., Spectra-Physics of Mountain View, Calif.; or by Cutting Edge Optronics, Inc. of St. Charles, Mo.

The focusing optics 507 may comprise one or more collimators 508 to collimate radiation 506 from the energy source 504 into a substantially parallel beam 510. This collimated radiation 510 may then focused by at least one lens 512 into a line of radiation 515 at the surface of the substrate 200.

Lens 512 may be any suitable lens, or series of lenses, capable of focusing radiation into a line. Lens 512 may be a cylindrical lens. Alternatively, lens 512 may be one or more concave lenses, convex lenses, plane mirrors, concave mirrors, convex mirrors, refractive lenses, diffractive lenses, Fresnel lenses, gradient index lenses, or the like.

The stage 514 may be any platform or chuck capable of securely holding a substrate, such as the substrate 200, during translation, as explained below. The stage 514 may include a means for grasping the substrate, such as a frictional, gravitational, mechanical, or electrical system. Examples of suitable means for grasping include mechanical clamps, electrostatic or vacuum chucks, or the like.

The focused beam annealing chamber 500 further comprises a translation mechanism 516 that may be configured to translate the stage 514 and the line of radiation 515 relative to one another. The translation mechanism 516 may be coupled to the stage 514 to move the stage 514 relative to the energy source 504 and/or the focusing optics 507. Alternatively, the translation mechanism 516 may be coupled to the energy source 504 and/or the focusing optics 507 to move the energy source 504 and/or the focusing optics 507 relative to the stage 514. In an alternative embodiment, the translation mechanism 516 may move both the energy source 504, and the stage 514. Any suitable translation mechanism may be used, such as a conveyor system, rack and pinion system, or the like.

The translation mechanism 516 may be coupled to a controller 517 to control the scan speed at which the stage 514 and the line of radiation 515 move relative to one another. In addition, translation of the stage 514 and the line of radiation 515 relative to one another may be along a path perpendicular to the line of radiation 515 and parallel to the surface of the substrate 200. In some embodiments, the translation mechanism 516 moves at a constant speed of approximately 2 cm/s for a 35 micron wide line. In some embodiments, the translation mechanism 516 may position the line of radiation 515 above a first portion of the substrate 200 for a desired time, and then move the line of radiation 515 to second portion of the substrate 200 and maintain the line of radiation 515 over the second portion for a desired time.

At least one gas injector 518 may be used to introduce or inject one or more gases into the reaction chamber 502. The gas injector 518 comprises at least one gas source 520 fluidly coupled via a gas distribution system 522 to one or more gas inlets 524 in a gas manifold 526. The one or more gas inlets 524 may be located at any suitable location within the reaction chamber 502. For example, gas may be injected at the side of the reaction chamber and flow across the surface of the substrate orthogonally to the direction of relative motion between the line of radiation and the surface of the substrate 200.

The processes of the focused beam annealing process chamber may be implemented using a controller. The controller 528 generally comprises a central processing unit (CPU) 530, a memory 532, and support circuits 534 and is coupled to and controls the focused beam annealing process chamber 500 and support systems 536, directly (as shown in FIG. 5) or, alternatively, via computers (or controllers) associated with the process chamber and/or the support systems 536.

The support systems 536 include components used to execute and monitor pre-determined processes (e.g., annealing the substrate 200) in the process chamber 500. Such components generally include various sub-systems. (e.g., gas panel(s), gas distribution conduits, vacuum and exhaust subsystems, and the like) and devices (e.g., power supplies, process control instruments, and the like) of the process chamber 500. These components are well known to those skilled in the art and are omitted from the drawings for clarity.

Figure 6:
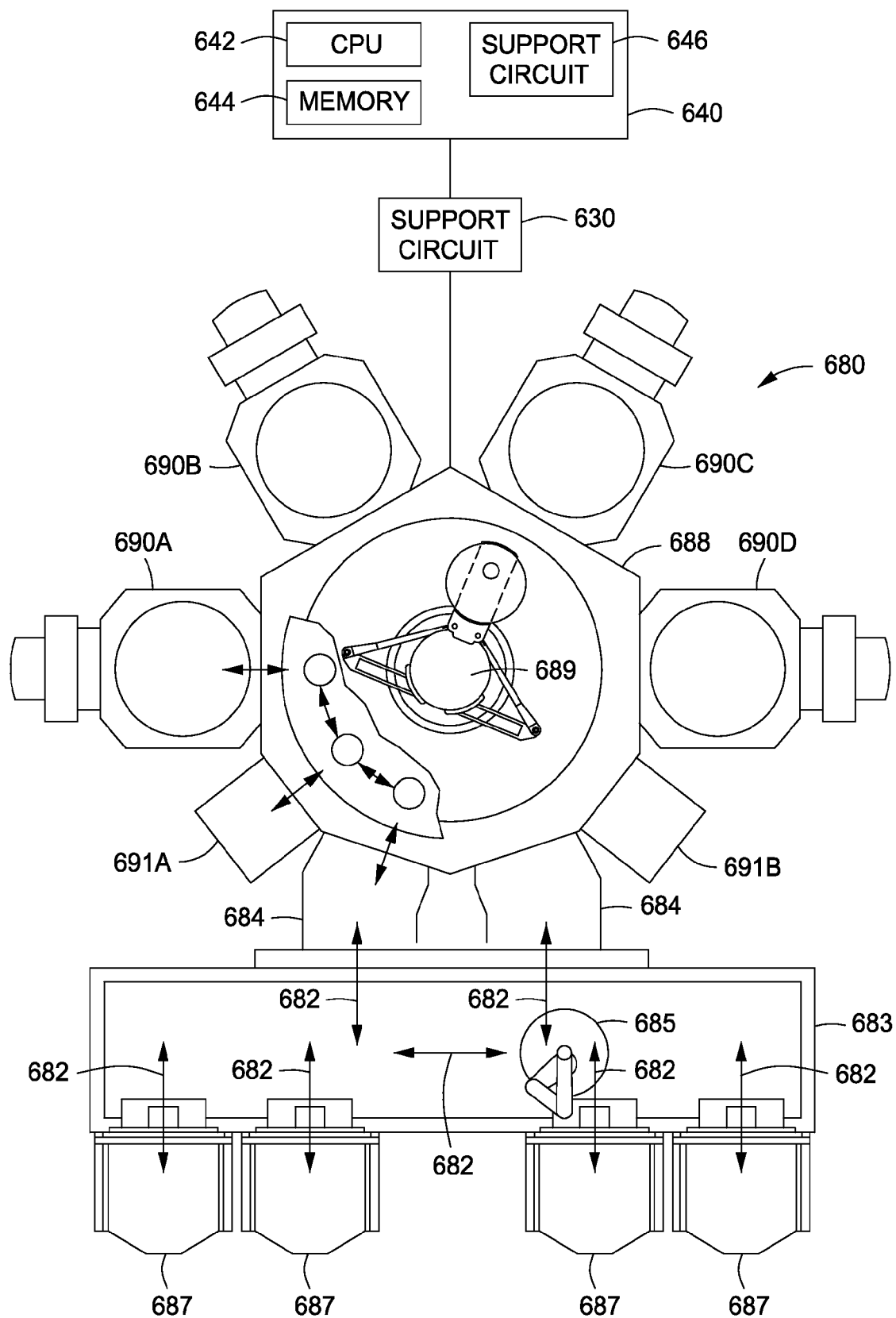
FIG. 6 depicts a cluster tool suitable for performing portions of the present invention.

FIG. 6 depicts a cluster tool suitable for performing portions of the present invention. Generally, the cluster tool is a modular system comprising multiple chambers (e.g., process chambers 590A-D, service chambers 591A-B, or the like) which perform various functions including substrate center-finding and orientation, degassing, annealing, deposition and/or etching. According to embodiments of the present invention, the cluster tool may include at least a semiconductor substrate process chamber configured to perform the inventive epitaxial growth of the source/drain region and may further include chambers such as ion implantation chambers, etch chambers, and the like. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool.

By way of illustration, a particular cluster tool 680 is shown in a plan view in FIG. 6 The cluster tool 680 generally comprises a plurality of chambers and robots and is preferably equipped with a microprocessor controller 681 programmed to carry out the various processing methods performed in the cluster tool 680. A front-end environment 683 is shown positioned in selective communication with a pair of load lock chambers 584. A pod loader 685 disposed in the front-end environment 683 is capable of linear and rotational movement (arrows 682) to shuttle cassettes of substrates between the load locks 684 and a plurality of pods 687 which are mounted on the front-end environment 683. The load locks 684 provide a first vacuum interface between the front-end environment 683 and a transfer chamber 688. Two load locks 684 are provided to increase throughput by alternatively communicating with the transfer chamber 688 and the front-end environment 683. Thus, while one load lock 684 communicates with the transfer chamber 688, a second load lock 684 communicates with the front-end environment 683. A robot 689 is centrally disposed in the transfer chamber 688 to transfer substrates from the load locks 684 to one of the various processing chambers 690A-D and service chambers 691A-B. The processing chambers 690A-D may perform various processes such as physical vapor deposition, chemical vapor deposition, etching, and the like, while the service chambers 691 may be adapted for degassing, orientation, cooldown, and the like.

For the purposes of practicing embodiments of the present invention, at least one of the processing chambers (for example, 690A) may be configured similar to the exemplary deposition chamber 300, illustrated in FIG. 3. Another at least one of the processing chambers (for example, 690B) may be adapted for ion implantation, similar to the exemplary toroidal source plasma ion immersion implantation reactor 400, illustrated in FIG. 4. Yet, another at least one of the processing chambers (for example, 690C) may be adapted for focused beam annealing, similar to the exemplary focused beam annealing chamber 500, illustrated in FIG. 5. Optionally, another at least one of the processing chambers (for example, 690D) may be a plasma etch chamber adapted to etch source/drain area and source/drain recesses in the p-type region in accordance with embodiments of the present invention. Accordingly, following an etch of the source/drain area and source/drain recesses, the substrate may be removed from the plasma etch chamber and transported to the process chamber 690A by the robot 689 to form the first and one or more second silicon layers.

Thus, NMOS transistors and methods for the formation of the same have been provided herein. The inventive NMOS transistors and methods may advantageously incorporate silicon, the lattice adjusting element and the n-type dopant element into a single crystal source/drain region facilitating improve electron mobility and junction resistance in the transistor device. Thus, the present inventive processes may facilitate a larger process window and the types of processes that may be utilized to grow a source/drain region in a NMOS transistor having the favorable characteristics of both increased tensile stress applied to the channel region, and improved junction resistance at the interface of the source/drain region and other components of the transistor device.

While the foregoing is directed to embodiments of the present invention, other and further embodiments of the invention may be devised without departing from the basic scope thereof.

What is claimed is:

1. A method for forming an n-type metal oxide semiconductor (NMOS) transistor, comprising:
    (a) providing a substrate having a p-type silicon region;
    (b) depositing a silicon seed layer atop the p-type silicon region using a first process with a first process gas;
    (c) depositing a silicon-containing bulk layer comprising silicon and an n-type dopant without a lattice adjusting element atop the silicon seed layer using a second process with a second process gas different than the first process gas;
    (d) implanting the lattice adjusting element into the silicon-containing bulk layer comprising silicon and the n-type dopant without the lattice adjusting element; and
    (e) annealing the silicon-containing bulk layer with an energy beam after implantation in (d).

2. The method of claim 1, wherein the lattice adjusting element is carbon.

3. The method of claim 1, wherein the n-type dopant comprises phosphorus, arsenic, or combinations thereof.

4. The method of claim 1, wherein the lattice adjusting element is carbon, and the n-type dopant is at least one of phosphorus or arsenic.

5. The method of claim 1, wherein implantation in (d) further comprises providing a plasma formed remotely from a process gas mixture comprising a lattice adjusting element-containing gas.

6. The method of claim 1, wherein the silicon-containing bulk layer is deposited to a thickness between about 300-400 angstroms.

7. The method of claim 1, wherein the silicon seed layer is deposited to a thickness of about 50 angstroms.

8. The method of claim 1, wherein the silicon seed layer and the silicon-containing bulk layer are epitaxially grown.

9. The method of claim 1, further comprising:
    etching a recess into the p-type silicon region to define a source/drain area prior to depositing the silicon seed layer at (b).

10. The method of claim 1, further comprising:
    cleaning the substrate with a process gas comprising hydrogen ($H_2$) prior to (b).

11. A non-transitory computer readable medium having instructions stored thereon that, when executed by a processor, causes a semiconductor process tool to perform a method of forming an n-type metal oxide semiconductor (NMOS) transistor, comprising:
    (a) providing a substrate having a p-type silicon region;
    (b) depositing a silicon seed layer atop the p-type silicon region using a first process with a first process gas;
    (c) depositing a silicon-containing bulk layer comprising silicon and an n-type dopant without a lattice adjusting element atop the silicon seed layer using a second process with a second process gas different than the first process gas;
    (d) implanting the lattice adjusting element into the silicon-containing bulk layer comprising silicon and the n-type dopant without the lattice adjusting element; and
    (e) annealing the silicon-containing bulk layer with an energy beam after implantation in (d).

12. The computer readable medium of claim 11, wherein implantation in (d) further comprises providing a plasma formed remotely from a process gas mixture comprising a lattice adjusting element-containing gas.

13. The computer readable medium of claim 11, further comprising:
    etching a recess into the p-type silicon region to define a source/drain area prior to depositing the silicon seed layer.

14. The computer readable medium of claim 11, further comprising:
    cleaning the substrate with a process gas comprising hydrogen ($H_2$) prior to (b).

15. A method for forming an n-type metal oxide semiconductor (NMOS) transistor, comprising:
    (a) providing a substrate having a p-type silicon region;
    (b) depositing a silicon seed layer atop the p-type silicon region using a first process with a first process gas;
    (c) depositing, using a second process with a second process gas different than the first process gas, a silicon-containing bulk layer comprising silicon without a lattice adjusting element and without a n-type dopant, or silicon and an n-type dopant without the lattice adjusting element atop the silicon seed layer;
    (d) implanting the lattice adjusting element and the n-type dopant into the silicon-containing bulk layer comprising silicon without the lattice adjusting element and without the n-type dopant, or implanting the lattice adjusting element into the silicon-containing bulk layer comprising silicon and the n-type dopant without the lattice adjusting element; and
    (e) annealing the silicon-containing bulk layer with an energy beam in a hydrogen atmosphere after implantation in (d).

16. The method of claim 15, wherein the lattice adjusting element is carbon.

17. The method of claim 15, wherein the n-type dopant comprises phosphorus, arsenic, or combinations thereof.

18. The method of claim 15, wherein implantation in (d) further comprises providing a plasma formed remotely from a process gas mixture comprising a lattice adjusting element-containing gas or a lattice adjusting element-containing gas and an n-type dopant element-containing gas.

* * * * *